United States Patent [19]

Kovacs et al.

[11] Patent Number: 4,840,866
[45] Date of Patent: Jun. 20, 1989

[54] MICROCAPSULE IMAGING SYSTEM HAVING IMPROVED DYNAMIC RANGE

[75] Inventors: Kerry Kovacs; William Simpson, both of Centerville; Amy L. Burkholder, Kettering; Russell K. Messer, Franklin; Teresa M. Thomas, Springfield, all of Ohio

[73] Assignee: The Mead Corporation, Dayton, Ohio

[21] Appl. No.: 172,624

[22] Filed: Mar. 24, 1988

[51] Int. Cl.⁴ .......................... G03C 1/46; G03C 1/72; G03C 5/00; G03C 1/495
[52] U.S. Cl. .................... 430/138; 427/221; 427/222; 430/170; 430/281; 430/314; 430/339; 430/341; 430/393; 430/394; 430/502; 430/914; 430/916; 430/927
[58] Field of Search ............... 430/138, 394, 502, 170, 430/281, 393, 314, 339, 341, 914, 916, 927; 427/221, 222

[56] References Cited

U.S. PATENT DOCUMENTS 4,399,209  8/1983  Sanders et al. ...................... 430/138
4,440,846  4/1984  Sanders et al. ...................... 430/138
4,576,891  3/1986  Adair et al. ......................... 430/138
4,587,194  5/1986  Adair et al. ......................... 430/138
4,772,530  9/1988  Gottschalk et al. ................ 430/138
4,772,541  9/1988  Gottschalk et al. ................ 430/314
4,800,149  1/1989  Gottschalk et al. ................ 430/138

Primary Examiner—Mukund J. Shah
Attorney, Agent, or Firm—Smith & Schnacke

[57] ABSTRACT

A photographic material exhibiting improved photographic characteristics comprising a photographic material comprising a support having a layer of microcapsules thereon, and an image-forming agent being associated with said microcapsules, said microcapsules including a mixture of a first subset of microcapsules and a second subset of microcapsules, said first and second subsets of microcapsules being associated with an image-forming agent for the same color, and said first subset of microcapsules providing a higher film speed than said second subset of microcapsules when said first and second subsets of microcapsules are exposed to a broad band white light source and developed under identical conditions.

17 Claims, 1 Drawing Sheet

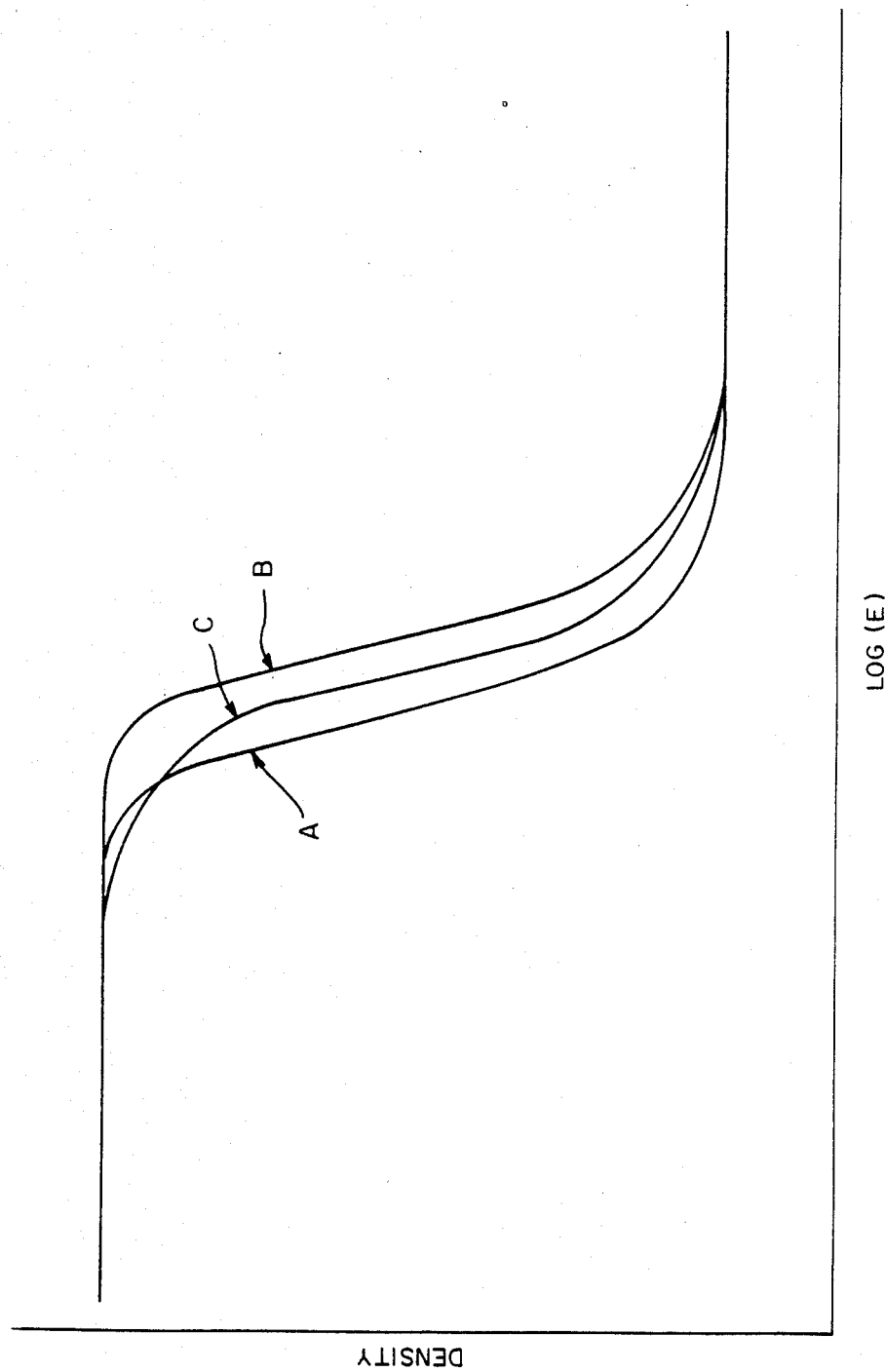

MICROCAPSULE IMAGING SYSTEM HAVING IMPROVED DYNAMIC RANGE

BACKGROUND OF THE INVENTION

The present invention relates to an imaging system employing photosensitive microcapsules having improved gamma and enhanced dynamic range.

Imaging systems employing photosensitive microcapsules are described in U.S. Pat. Nos. 4,399,209 and 4,440,846 to The Mead Corporation. Using these systems, images are formed by the exposure-controlled release of an an image-forming agent from a microcapsule containing a photohardenable composition. The image forming agent is typically a substantially colorless color precursor which reacts with a developer to form a visible image.

U.S. application Ser. No. 339,917 discloses a full color imaging system wherein three sets of microcapsules which are sensitive to different bands of radiation are employed. These microcapsules respectively contain cyan, magenta and yellow color precursors.

A panchromatic full color imaging system is described in Published European Application No. 0233587.

U.S. Pat. No. 4,587,194 to Adair et al. discloses an imaging material which utilizes two sets of microcapsules wherein the microcapsules exhibit the same spectral sensitivity and one set of microcapsules exhibits a higher film speed than the other set. This imaging material is designed as a two color, intensity controlled, imaging material. In this material, different image-forming agents are associated with the microcapsules. The imaging material is employed in an image-forming process wherein the imaging sheet is exposed to different intensities of radiation using a time or intensity modulated radiation source such as a laser. High intensity exposure polymerizes both sets of microcapsules and prevents the formation of any color upon development. Low intensity exposure polymerizes the higher speed microcapsules without polymerizing the lower speed microcapsules and results in the production of the color of the image-forming agent associated with the low speed microcapsules. No exposure results in the mixed of the image-forming agents associated with higher speed and lower speed microcapsules.

SUMMARY OF THE INVENTION

The present invention relates to an improvement in the imaging systems employing photosensitive microcapsules wherein a mixture of microcapsules having the same spectral sensitivity but different film speeds is employed to control the shape of the H and D curve and improve the photographic characteristics including the dynamic range of the imaging system.

While the present invention can be embodied in a monochromatic imaging system to reduce contrast, it is preferably used in full color and more particularly panchromatic systems as a means to match the gamma of the cyan, magenta and yellow microcapsules and thereby to improve color balance. For example, it is useful in slowing the toe speed of magenta microcapsules to bring the magenta H and D curve into line with the cyan and yellow H and D curve.

Accordingly, one manifestation of the present invention is a photosensitive material comprising a support having a layer of microcapsules on the surface thereof, said microcapsules including mixture of at least a first subset of microcapsules and a second subset of microcapsules, said first subset of microcapsules and said second subset of microcapsules containing an image-forming agent for the same color and said first subset of microcapsules having higher film speed than said second subset of microcapsules.

A further manifestation of the present invention is a full color photographic material comprising a support having a layer of microcapsules on the surface thereof, said microcapsules including a first set of microcapsules sensitive to a first wavelength band and containing a first photohardenable composition and a cyan image-forming agent, a second set of microcapsules sensitive to a second wavelength band and containing a second photohardenable composition and a magenta image-forming agent, and a third set of microcapsules sensitive to a third wavelength band containing a third photohardenable composition and a yellow image-forming agent wherein at least one of said first, second and third sets of microcapsules is a mixture of at least a first subset of microcapsules and a second subset of microcapsules wherein said first subset of microcapsules has a higher film speed than said second subset of microcapsules.

In accordance with a further manifestation of the invention the microcapsules having higher film speed may contain a photohardenable composition including a silver initiator whereas the microcapsules having the lower film speed contain a photohardenable composition including a non-silver initiator.

The present invention further relates to a method for controlling the characteristics of the H and D curve including gamma and dynamic range for a photographic material employing photosensitive microcapsules containing a photohardenable composition and an image-forming agent, which comprises blending a first subset of microcapsules having a first film speed with a second subset of microcapsules having a second film speed wherein said first film speed is greater than said second film speed, said film speeds being measured for said microcapsule when exposed to a broad band white light source and developed under identical conditions, said microcapsules containing an image-forming agent for the same color.

BRIEF DESCRIPTION OF THE DRAWINGS

The FIGURE illustrates two H and D curves (A and B) for two hypothetical subsets of microcapsules useful in the present invention and a third H and D curve (C) for a hypothetical blend of microcapsules in accordance with the present invention.

DEFINITION

The term "higher film speed" as used herein with respect to the microcapsules is determined for the toe of the H and D curve by measuring the film speed of the microcapsules using a broad band white light source such as a tungsten lamp.

DETAILED DESCRIPTION

Reference can be made to U.S. Pat. Nos. 4,399,209 and 4,440,846, U.K. Pat. No. 2,113,860 and European Published Application No. 0 233 587 for examples of imaging systems, including full color and panchromatic imaging systems which can be modified in accordance with the present invention to include blends of microcapsules to control gamma, H and D curve shape, and improve dynamic range.

The FIGURE illustrates representative H and D curves for two subsets of microcapsules which may be blended in accordance with the present invention to control photographic characteristics. Curve A is an H and D curve for an imaging sheet prepared using higher speed microcapsules. Curve B is an H and D curve for an imaging sheet prepared using lower speed microcapsules. When these capsules are blended, H and D curve C results.

The present invention can be used to control the H and D curve including gamma in any imaging system employing photosensitive microcapsules. In monochromatic systems, it reduces contrast and extends dynamic range. In full color systems it is an effective means for improving color balance.

Full color and panchromatic imaging systems are described in U.S. Pat. No. 4,576,891, European Published Application No. 0 233 587 and U.K. Pat. No. 2,113,860. These systems are preferably single exposure systems which employ three sets of microcapsules which respectively contain cyan, magenta and yellow color precursors. As explained in more detail in the aforementioned references, each set of microcapsules is primarily sensitive in a different wavelength band such that the microcapsules can be individually exposed with minimum cross-talk. In panchromatic systems, the cyan, magenta and yellow forming photosensitive microcapsules are respectively sensitive to red, green and blue light.

In designing full color, single exposure, imaging systems, it is critical that each of the three sets of microcapsules (cyan, magenta and yellow) have similar H and D curves. Otherwise the system will not provide good color balance. In accordance with the present invention, one or more of the cyan, magenta and yellow sets of microcapsules is formed of a blend of microcapsules having different film speeds to adjust the H and D curve (e.g., gamma and dynamic range) of that set of microcapsules such that it approximately matches or approaches that of the other sets and better color balance is achieved. While it is difficult to match the H and D curves exactly, by matching the curves as closely as possible, color balance is optimized.

The film speeds of microcapsules can be adjusted within a given wavelength band to provide microcapsules having higher and lower film speeds through a number of different techniques. In the most common technique, the concentration of the photoinitiators is higher in one subset of microcapsules than another such that one set of microcapsules is substantially faster than the other. Monomer compositions can also be varied between two subsets of microcapsules such that one set is faster than the other. Another means to establish a difference in film speeds is to incorporate a radiation absorber in one set of microcapsules as opposed to another or to vary the concentration of an absorber so as to effectively partially screen the photosensitive composition in one subset of microcapsules versus the other. Differences in film speed have also been observed using different wall formers for preparing the microcapsules or by varying the size of the microcapsules. Some microcapsule walls apparently are more effective in screening oxygen from the photosensitive composition or preventing oxygen penetration. Oxygen is a known inhibitor of free radical polymerization and hence the permeability of the microcapsules to oxygen can directly affect film speed.

Another consideration in designing microcapsules to have different film speeds is selection of the photoinitiator system. Some photoinitiator systems are much more efficient in generating free radicals and/or in reacting with oxygen than others and hence, selections in this regard can also be made to provide a mixture of microcapsules which exhibits improved gamma when the microcapsules are blended. This technique is generally not the most desirable one, however, since differences in absorption characteristics of the initiators can result in poor color hues as the initiators respond differently to the exposure source. In addition to controlling those elements of the imaging system described above, in order to achieve maximum control over the characteristics of the H and D curve, it is critical to control the microencapsulation process itself. For example, microcapsule size distribution is known to affect directly the shoulder speed and the toe speed of the H and D curve. Improvements in gamma and dynamic range can be lost or achieved at the expense of other photographic properties if the variability of the microencapsulation process is high.

Examples of two blue-sensitive photohardenable compositions for use in higher speed and lower speed microcapsules are provided in the following table.

TABLE

|  | High Speed Compositions Parts | Lower Speed Compositions Parts |
| --- | --- | --- |
| Composition (I) | | |
| TMPTA | 500 | 500 |
| 7-Diethyl-3-cinnamoyl Coumarin | 3 | 3 |
| Ethyl p-Dimethylamino Benzoate | 2 | 2 |
| Quanticure BMS (Ward-Benkinsop) | 6 | 0 |
| Composition (II) | | |
| Photomer 4149 (Diamond Shamrock) | 500 | 500 |
| 7-Diethyl-3-cinnamoyl Coumarin | 0.8 | 0.6 |
| Ethyl p-Dimethylamino Benzoate | 2 | 2 |

Another example of a higher speed microcapsule useful in the present invention is a microcapsule containing a polymerizable compound and a light sensitive silver halide as one component of the initiator system. Such microcapsules and this initiator system are described in European Patent Publication No. 0 203 613. After exposure, these microcapsules must be heated to temperatures of about 80° to 200° C. to polymerize the polymerizable compound. In addition to the silver halide, this initiator system includes a reducing agent and preferably an organic silver salt oxidizing agent and a base or base precursor. A sensitizing dye is associated with the silver halide in a known manner to give it the appropriate spectral sensitivity. Useful silver halides include silver bromide, silver iodobromide, and silver chlorobromide emulsions. Examples of the reducing agent include $\beta$-acetyl-p-aminophenyl-hydrazine and 1,1'-azobis(1-cyclohexanecarbonitride). The most typical example of the organosilver salt is silver behenate.

The quantity of the difference in film speed between the higher and lower speed microcapsules is not critical in the sense that a blend of microcapsules exhibiting any difference, no matter how small, will theoretically provide some change in the H and D curves. However, as a practical matter differences in film speed (toe speed) between the higher and lower speed microcapsules of about 1 to 3 steps are used. The difference in film speed should be such that images with good hue and color balance are obtained. If the difference in film speed is too great, poor color hue may result.

In accordance with one embodiment of the invention, a mixture of microcapsules containing a silver initiator and microcapsules containing an organic initiator is used. The microcapsules containing the silver initiator are typically substantially faster than the microcapsules containing the organic initiator.

The ratio of the higher speed to the lower speed microcapsules can be varied as a direct function of the H and D curve which is desired and the H and D curves of individual higher and lower speed microcapsules. Usually the two sets of microcapsules are mixed in a weight ratio of 1/5 to 5/1. Furthermore, while this discussion is in terms of blending two groups of microcapsules of different film speed those skilled in this art will recognize that two or more groups of microcapsules may be used for this purpose. Thus, blends of 3 or more microcapsules can be used if necessary to obtain the desired H and D characteristics.

One of the preferred initiator systems for use in the present invention, in either or both the higher and lower speed microcapsules, includes the ionic dye-counter ion compound described in European Application Publication No. 0 233 587 (which is incorporated herein by reference) is used. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyrylium complexes may also be used.

Examples of other photoinitiators useful in the present invention include diaryl ketone derivatives, quinones and benzoin alkyl ethers. Where ultraviolet sensitivity is desired, suitable photoinitiators include alkoxy phenyl ketones, O-acylated oximinoketones, polycyclic quinones, phenanthrenequinone, naphthoquinone, diisopropylphenanthrenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones and haloalkanes. In many cases it is advantageous to use a combination of photoinitiators.

Non-silver organic initiators including the ionic dye complexes preferably include an autoxidizer in combination with the dye complex. Suitable examples include N,N,-dialkylanilines and thiols as described in the European Publication.

The photographic materials of the present invention can be used in conjunction with various radiation sensitive materials and image-forming agents to produce images by a number of different techniques.

For example, positive working photohardenable or negative working photosoftenable radiation sensitive compositions can be used. Photohardenable compositions such as photopolymerizable and photocrosslinkable materials increase in viscosity or solidify upon exposure and yield positive images. Photosoftenable materials, such as some photodecomposable or photodepolymerizable materials, decrease in viscosity and result in negative images.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup are ethylenically unsaturated acid esters of polyhydric alcohols, such as trimethylol propane triacrylate (TMPTA) and dipentaerythritol hydroxypentaacrylate (DPHPA).

Various image-forming agents can also be used. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. The internal phase itself has its own image-forming capability. For example, it is known that many of the toners used in xerographic recording processes selectively adhere to the image areas of an imaging sheet exposed and developed as in the present invention.

Furthermore, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated developer sheet.

In accordance with the present invention, in contrast to the imaging system described in U.S. Pat. No. 4,587,194, the image forming agent associated with the sets of microcapsules making up the mixture which provides controlled gamma is the same compound or at least the same color (in the case of a dye and pigment) or capable of producing the same color (in the case of a color precursor). Typical color precursors useful in the aforesaid embodiments include colorless electron donating type compounds. Representative examples of such color formers include substantially colorless compounds having their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI (products of Hilton-Davis Chemical Co.) and Reakt Yellow (a product of BASF) are often used alone or in combination as color precursors in the present invention.

Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxynaphthoate, zinc 3,5 di-tert-butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. A preferred class of glossable developers is described in commonly assigned U.S. application Ser. No. 073,036, filed July 14, 1987.

The most common substrate for imaging sheets in accordance with this invention is a transparent film or paper. The paper may be a commercial impact raw stock, or special grade paper such as cast-coated paper or chrome-rolled paper. The latter two papers are preferred when using microcapsules having a diameter between approximately 1 and 5 microns because the surface of these papers is smoother and therefore the microcapsules are not as easily embedded in the stock fibers. Transparent substrates such as polyethylene terephthalate (PET) translucent substrates can also be used in this invention. Another preferred substrate for the microcapsules is aluminized PET.

It has been found that a uniform re-exposure or a co-exposure can be used to further improve the sensitivity of the imaging sheet by generating radicals which react with the oxygen present in the microcapsules to prevent it from inhibiting the imaging photochemistry during the imaging exposure. For example, a deoxygenating exposure may be conducted by uniformly exposing the sheet to radiation of an intensity which is insufficient to form images but sufficient to sequester the oxygen present in the microcapsules. This can be carried out simultaneously with imaging exposure. Alternatively, a uniform de-oxygenating pre-exposure can be used at a somewhat higher intensity but over a shorter exposure time so as to react with the oxygen present without imaging. In both cases, the total deoxygenating exposure (intensity × time) is sufficient to react with the oxygen in the microcapsules without initiating the imaging photochemistry. The effectiveness of de-oxygenating exposure is improved when the cover sheet is applied before exposure because the cover sheet slows the diffusion of atomospheric oxygen into the imaging sheet.

The discrete walled microcapsules used in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al.) including gum arabic, polyvinyl alcohol, carboxy-methyl-cellulose; resorcinol-formaldehyde wall formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kiritani et al.); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle). A melamine-formaldehyde capsule is particularly preferred.

The mean microcapsule size used in the present invention generally ranges from about 1 to 25 microns.

An open phase system may be used instead of discrete microcapsules. This can be done by dispersing what would otherwise be the internal phase throughout a binder as discrete droplets and coating the composition on the substrate. Suitable coatings for this embodiment include polymer binders whose viscosity has been adjusted to match the dispersion required in the coating. Suitable binders are gelatin, polyvinyl alcohol, polyacrylamide, and acrylic lattices.

The imaging sheets of the present invention can be constituted such that they are sensitive to ultraviolet, visible, or other types of actinic radiation. Depending upon the exposure source used and the nature of the exposing radiation, the exposure alone may cause a sufficient change in the viscosity of the internal phase to control imaging. Otherwise, exposure can be used to initiate or advance the photochemistry in the exposed areas and a subsequent uniform exposure or heat treatment can be used to enhance the image.

The present invention is further illustrated by the following non-limiting examples.

EXAMPLE 1

Photosensitive melamine-formaldehyde microcapsules containing a magenta color precursor were prepared by the process described in U.S. application Ser. No. 128,292 filed Dec. 3, 1987. The microcapsules had the following internal phase compositions.

|  | Parts |
| --- | --- |
| Higher Speed Capsules | |
| TMPTA (trimethylolpropane triacrylate) | 60 |
| N,N'—Diheptylindocarbocyanine Triphenyl-n-butylborate | 0.32 |
| DIDMA (N,N—dimethyl-2,6-diisopropylaniline | 0.60 |
| Magenta Color Precursor (3-(1-Butyl-2-2,6-di-tert-butyl-4-methylphenyl methylindol-3-yl)-3-(1-octyl-2-methylindol-3-yl)phthalide | 14.4 |
| Desmodur N-100 (a biuret group containing polyisocyanate available from Mobay) | 4.0 |
| BHT 2,6-di-tert-butyl-4-methylphenol- (thermal polymerization inhibitor) | 0.15 |
| Lower Speed Capsules | |
| TMPTA | 60 |
| N,N'—Diheptylindocarbocyanine Triphenyl-n-butylborate | 0.18 |
| DIDMA | 0.60 |
| Magenta Color Precursor | 14.4 |
| Desmodur N-100 (Mobay) | 4.0 |
| BHT | 0.15 |

The photographic characteristics of the capsules and the blend are shown in the following table.

|  | Higher Speed | Lower Speed | Blend |
| --- | --- | --- | --- |
| Shoulder | 2.9 | 3.09 | 2.98 |
| Toe | 3.34 | 3.53 | 3.49 |
| Range | 0.44 | 0.44 | 0.51 |
| Gamma | 3.73 | 3.76 | 3.22 |

EXAMPLE 2

Microcapsules were prepared as in Example 1 having the following internal phase composition.

|  | Parts |
| --- | --- |
| Lower Speed Capsules | |
| TMPTA | 150 |
| Photoinitiator (Ex. 1) | 0.30 |
| DIDMA | 1.5 |
| Desmodur N-100 | 9.99 |
| Color Precursor (see Ex. 1) | 36.0 |
| Higher Speed Capsules | |
| TMPTA | 150 |
| Photoinitiator (see Ex. 1) | 0.60 |
| DIDMA | 1.5 |
| Desmodur N-100 | 10.18 |

-continued

| | Parts |
|---|---|
| Color Precursor (see Ex. 1) | 36.0 |

A 50/50 blend of microcapsules provided 2 steps improvement from the shoulder to the toe of the H and D curve.

Having described the invention in detail and by reference to preferred embodiments thereof, it will be apparent that modifications and variations are possible without departing from the scope of the invention defined in the appended claims.

What is claimed is:

1. A photographic material comprising a support having a layer of microcapsules thereon and an image-forming agent being associated with said microcapsules, said microcapsules including a mixture of a first subset of microcapsules and a second subset of microcapsules, said first and second subsets of microcapsules being associated with an image-forming agent for the same color, and said first subset of microcapsules providing a higher film speed than said second subset of microcapsules when said first and second subsets of microcapsules are exposed to a broad band white light source and developed under identical conditions.

2. The photographic material of claim 1 wherein said microcapsules making up said first subset contain a first photohardenable composition and said microcapsules making up said second subset contain a second photohardenable composition, said first photohardenable composition exhibiting a higher film speed than said second photohardenable composition.

3. The photographic material of claim 2 wherein said layer of microcapsules comprises a first set of microcapsules sensitive to a first wavelength band and containing a first photohardenable composition and a cyan image-forming agent, a second set of microcapsules sensitive to a second wavelength band and containing a second photohardenable composition and a magenta image-forming agent, and a third set of microcapsules sensitive to a third wavelength band containing a third photohardenable composition and a yellow image-forming agent, wherein at least one of said first, second and third sets of microcapsules includes said mixture of said first subset of microcapsules and said second subset of microcapsules.

4. The photographic material of claim 3 wherein said first set of microcapsules is sensitive to red light, said second set of microcapsules is sensitive to green light, and said third set of microcapsules is sensitive to blue light.

5. The photographic material of claim 4 wherein at least one of said first, second, and third photohardenable compositions contains an ionic dye-counter ion complex as a photoinitiator.

6. The photographic material of claim 5 wherein said ionic dye-counter ion complex is a cationic dye-borate complex.

7. The photorahic material of claim 6 wherein said cationic dye-borate complex is a cyanine dye-triphenylalkyl borate complex.

8. The photographic material of claim 1 wherein at least one of said first and second subsets of microcapsules includes a photohardenable composition comprising a light-sensitive silver halide, a reducing agent, and a polymerizable compound.

9. The photographic material of claim 8 wherein said photosensitive composition further contains an organic silver salt oxidizing agent.

10. The photographic material of claim 9 wherein said photosensitive composition additionally contains a base or a base precursor.

11. The photographic material of claim 10 wherein said second subset of microcapsules contains a photohardenable composition including a non-silver organic initiator.

12. The photographic material of claim 11 wherein said non-silver organic initiator is an ionic dye-counter ion complex.

13. The photographic material of claim 2 wherein said mixture of microcapsules provides a gamma such that said photographic material exhibits good color balance.

14. The photographic material of claim 13 wherein the weight ratio of said first subset of microcapsules to said second subset of microcapsules is approximately 1/5 to 5/1.

15. A method for controlling the characteristics of the H and D curve including gamma and dynamic range for a photographic material employing photosensitive microcapsules containing a photohardenable composition and an image-forming agent, which comprises blending a first subset of microcapsules having a first film speed with a second subset of microcapsules having a second film speed wherein said first film speed is greater than said second film speed, said film speeds being measured for said microcapsules when exposed to a broad band white light source and developed under identical conditions, said microcapsules containing an image-forming agent for the same color.

16. The method of claim 15 wherein said first and second subsets of microcapsules are blended in amounts which provide improved color balance.

17. The method of claim 16 wherein said first and second subsets of microcapsules are present in a photographic material including other photosensitive microcapsules for other colors and wherein said first and second microcapsules are blended such that the H and D curve for said blend approximates the H and D curve for said other photosensitive microcapsules.

* * * * *